United States Patent [19]
Nyul

[11] 3,867,666
[45] Feb. 18, 1975

[54] HIGH DENSITY LIGHT EMITTING DIODE ARRAY

[75] Inventor: Paul Nyul, New Holland, Pa.

[73] Assignee: RCA Corporation, New York, N.Y.

[22] Filed: Mar. 19, 1974

[21] Appl. No.: 452,545

[52] U.S. Cl. .................... 313/500, 307/311, 357/17, 357/56, 357/81
[51] Int. Cl. .................... H05b 33/00
[58] Field of Search .......... 313/499, 500; 315/169 R, 315/169 TV; 340/166 R, 166 EL, 324 R, 340/324 M; 307/311; 357/17, 56, 81

[56] References Cited

UNITED STATES PATENTS

| | | | |
|---|---|---|---|
| 3,270,235 | 8/1966 | Loebner | 313/499 |
| 3,309,553 | 3/1967 | Kroemer | 313/499 |
| 3,343,026 | 9/1967 | Luechinger et al. | 313/499 |
| 3,517,258 | 6/1970 | Lynch | 315/169 R |

*Primary Examiner*—Siegfried H. Grimm
*Attorney, Agent, or Firm*—Glenn H. Bruestle; Donald S. Cohen

[57] ABSTRACT

A plurality of light emitting diodes are mounted in spaced relation in a recess in a conductive substrate. Each light emitting diode has regions of opposite conductivity type which form a PN junction and each light emitting diode has a light emitting end surface. The regions of the same conductivity are electrically connected to the substrate and each one of the regions of the opposite conductivity are electrically connected to a separate one of a plurality of contact terminals. The light emitting end surfaces of the light emitting diodes face in substantially the same direction.

6 Claims, 6 Drawing Figures

HIGH DENSITY LIGHT EMITTING DIODE ARRAY

BACKGROUND OF THE INVENTION

The present invention relates to a high density array of precisely located light emitting diodes, and particularly to such an array wherein an electrical current can be applied across each one of the light emitting diodes.

It has been proposed to provide a high density array of light emitting diodes by disposing a plurality of light emitting diodes on a supporting base and electrically connecting the diodes to a source of electrical energy. These prior art assemblies, however, have been relatively difficult and expensive to manufacture and employ because of the difficulty in wiring the diodes and arranging the diodes in an optically aligned pattern.

It would therefore be desirable to develop a high density array of precisely located light emitting diodes wherein each one of the light emitting diodes can be individually addressed, i.e., an electrical current can be applied across each one of the light emitting diodes. Such an array would be useful, e.g., as a credit card preparer and reader. The light emitting diode array would be required to possess a high density of precisely located light emitting diodes, each of which being individually addressable. Furthermore, the light emitting diode array would be required to operate in both the coherent and incoherent mode in order to be able to prepare the code and read the code.

SUMMARY OF THE INVENTION

A high density array for light emitting diodes including a conductive substrate having a recess in a surface thereof. A plurality of light emitting diodes are mounted in spaced relation in the recess of the conductive substrate. Each of the light emitting diodes has regions of opposite conductivity type which form a PN junction. Each of the regions has a surface and each light emitting diode has a light emitting end surface. The light emitting diodes are mounted with the surfaces of one of the regions of the same conductivity in electrical contact with the substrate and the surfaces of the regions of the opposite conductivity substantially coplanar with at least a portion of the surface of the substrate. The light emitting surfaces of each one of the diodes face in substantially the same direction. Means are provided for applying an electrical current across each one of the light emitting diodes.

DETAILED DESCRIPTION

Figure 1:
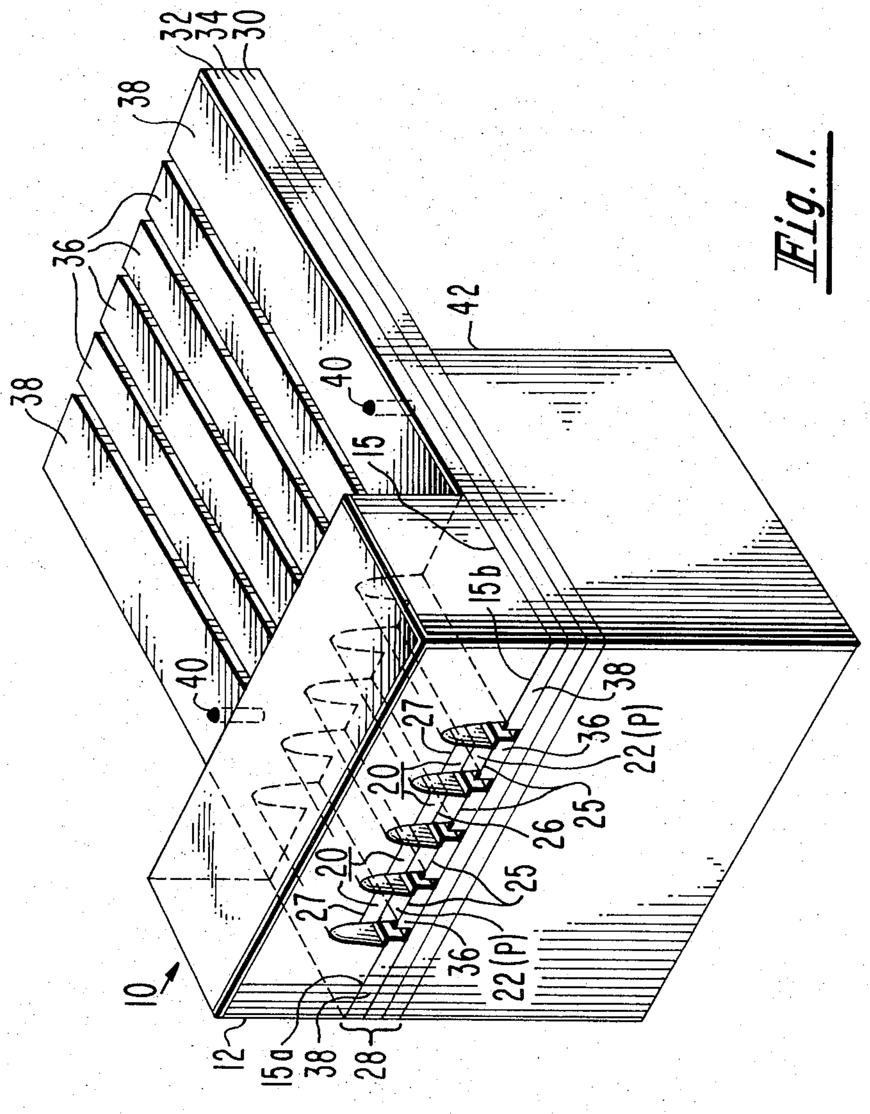
FIG. 1 is a perspective view of one form of a high density light emitting diode array of the present invention.
Figure 2:
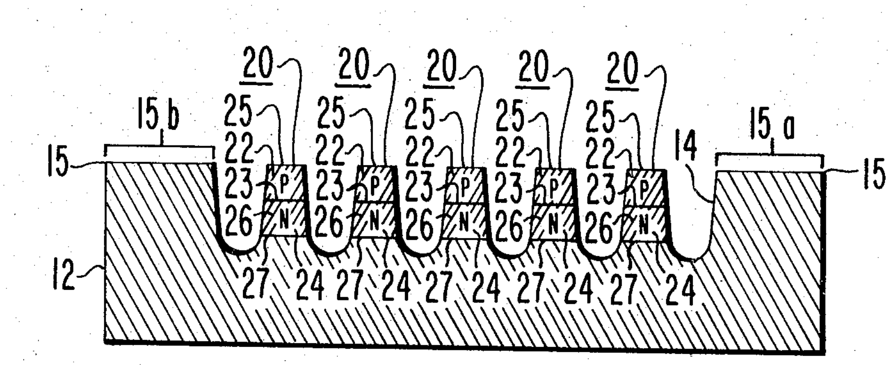
FIG. 2 is a sectional view of one form of a subassembly for a high density light emitting diode array of the present invention.

Referring initially to FIG. 1, one form of a high density light emitting diode array of the present invention is generally designated as 10. The light emitting diode array 10 comprises a conductive substrate 12 having a recess 14 formed in a surface 15 thereof with a pair of substantially coplanar surfaces 15*a* and 15*b* adjacent to the recess 14 (see FIG. 2). A plurality of light emitting diodes 20 are mounted in spaced relation in the recess 14 of the conductive substrate 12 as shown in FIG. 2. Each one of the light emitting diodes 20 includes contiguous regions 22 and 24 of opposite conductivity type, e.g., a P region and an N region as in FIG. 2, forming a PN junction 23 therebetween. The regions 22 and 24 include opposing surfaces 25 and 27, respectively. The light emitting diodes 20 are mounted in the recess 14 of the conductive substrate 12 with the surfaces 27 of the regions 24 being electrically and mechanically secured to the bottom surface of the recess so that the conductive substrate 12 is electrically connected to the same conductivity type region of all of the light emitting diodes 20. The surfaces 25 of the region 22 of each one of the light emitting diodes 20 are substantially coplanar with at least one of the surfaces 15*a* and 15*b* of the conductive substrate 12 and preferably coplanar with both of the surfaces 15*a* and 15*b*. The light emitting diodes 20 can be formed through any well known method, e.g., the method described in U.S. Pat. No. 3,471,923 issued on Oct. 14, 1969 entitled "Method of Making Diode Arrays." The light emitting diodes formed in accordance with the previously mentioned U.S. Pat. No. 3,471,923 can operate in the coherent or incoherent mode depending on the biasing applied. The light emitting surfaces 26 of each one of the light emitting diodes 20 face in substantially the same direction as indicated in FIG. 1.

Figure 3A:
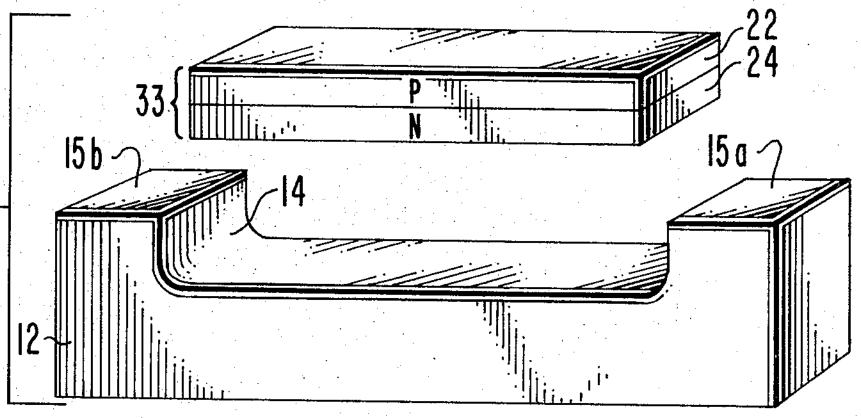
FIGS. 3*a* and 3*b* are perspective views showing the steps of making one form of a high density light emitting diode array of the present invention.
Figure 3B:
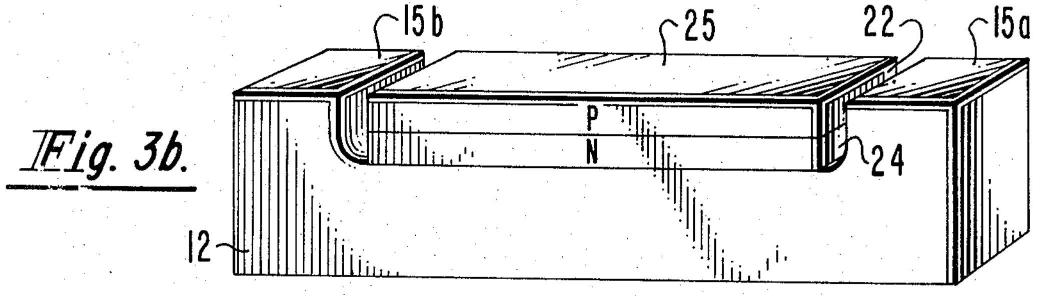

The high density light emitting diode array 10 can be constructed by first forming a recess 14 in a conductive substrate 12, such as copper, through methods well known in the art, e.g., machining to the desired shape, as shown in FIG. 3a. The conductive substrate 12 with the recess 14 is then utilized to receive a sliver 33 of light emitting diode material of a length sufficient to provide the desired number of individual light emitting diodes 20, also shown in FIG. 3*a*. The sliver 33 of diode material with the regions 22 and 24, respectively, of opposite conductivity may be formed outside the recess 14 by the well known method of liquid phase epitaxy. The sliver 33 can be formed on a wafer and then cleaved to the proper dimensions as is well known in the art. The sliver 33 of diode material is then alloyed, e.g., soldered, to the recess 14 of the conductive substrate 12, as shown in FIG. 3*b*. The surface 25 of the region 22 of the sliver 33 of diode material is formed so as to be substantially coplanar with the surfaces 15*a* and 15*b* of the conductive substrate 12.

The individual light emitting diodes 20 of FIGS. 1 and 2 can then be formed in the recess 14 of the conductive substrate 12 through a gang cutting operation. A frame of wires is employed in the well known wire cutting technique wherein wires carrying abrasive particles, e.g., silicone carbide suspended in glycerine, are drawn over the sliver of light emitting diode material. The wires are chosen with a suitable diameter and are placed on centers equal to the desired diode to diode centers. After the cutting operation, the result will be substantially similar to the subassembly as shown in FIG. 2.

In the use of the high density light emitting diode array 10 of the present invention, the regions 22 and 24 of each one of the light emitting diodes 20 are electrically connected to a source of electrical energy. The source of electrical energy is utilized to apply an electrical current across each one of the light emitting diodes 20. The region 24 of each one of the light emitting diodes 20 is already connected to the conductive substrate 12 through the surface 27. Therefore, to provide full electrical connection to the light emitting diodes 20, it is only necessary to connect the conductive substrate 12 to one side of a source of electrical energy and then connect the region 22 of the light emitting diodes 20 to the other side of the source of electrical energy.

For example, a laminated member 28 can be employed as shown in FIG. 1 for electrically connecting the light emitting diodes 20 to a source of electrical energy capable of applying an electrical current across each light emitting diode 20. The laminated member 28 includes a pair of conducting layers 30 and 32 separated by an insulating layer 34. The conducting layer 32 includes a plurality of substantially coplanar diode contact terminals 36 with at least one substantially coplanar substrate contact terminal 38. Each one of the diode contact terminals 36 of the laminated member 28 is in contacting relation with a separate one of the coplanar surfaces 25 of the regions 22 of each one of the light emitting diodes 20 and at least one substrate contact terminal 38 is in contacting relation with at least a portion of either surface 15a or 15b. It is preferable that the diode contact terminals 36 be slightly wider in width than each of the light emitting diodes 20 in order to minimize the potential difficulty in aligning the light emitting diodes 20 and the laminated member 28. It may sometimes be advantageous to fan out the diode and substrate contact terminals 36 and 38 in order to be more easily connected to a source of electrical energy. The conducting layer 30 of the laminated member 28 is electrically connected to at least one of the substrate contact terminals 38, e.g., a conductive passageway 40 extending through the insulated layer 34 and contacting the substrate contact terminal 38. A mounting block 42, of a material having good heat conducting properties, such as copper, can be provided for the light emitting diode array 10 as shown in FIG. 1.

The laminated member 28 of high density light emitting diode array 10 of FIG. 1 can be easily fabricated by methods well known in the art, e.g., depositing a pair of conducting layers, such as copper, on an insulating layer. The diode and substrate contact terminals 36 and 38 can be formed by the well known method of photolithography. If a flexible laminated member 28 were desired, a material such as poliamide could be used as the insulating layer 34. A flexible laminated member 28 would permit the light emitting diode array 10 to be mounted wherein the light emitting surfaces 26 of the light emitting diodes 20 could be at an angle of 90 degrees with the laminated member 28. The laminated member 28 can be alloyed to the conductive substrate 12 wherein each one of the diode contact terminals 36 is in electrical contact with a separate one of the regions 22 of each one of the light emitting diodes 20 and the substrate contact terminal 38 is in electrical contact with at least a portion of the surfaces 15*a* or 15*b*. The conducting layer 30 of the laminated member 28 can be electrically connected to the substrate contact terminal 38 by drilling through the conducting layer 30 and the insulating layer 34 to reach the substrate contact terminal 38. A conductive passageway 40 can then be formed in the drilled hole, e.g., dropping solder in the drilled hole. The mounted block 42 can be secured by any conventional method, e.g., soldered.

The high density light emitting diode array 10 of FIG. 1 permits the user to individually address the array merely by electrically connecting the appropriate diode and substrate contact terminals 36 and 38 or the diode contact terminals 36 and the conducting layer 30 to a source of electrical energy. For example, the light emitting diodes 20 can be individually addressed by connecting the appropriate diode contact terminal 36 and a substrate contact terminal 38 to a source of electrical energy. If desired, the light emitting diodes 20 can also be individually addressed by connecting the appropriate diode contact terminal 36 and the conducting layer 30 to the source of electrical energy.

Figure 4:
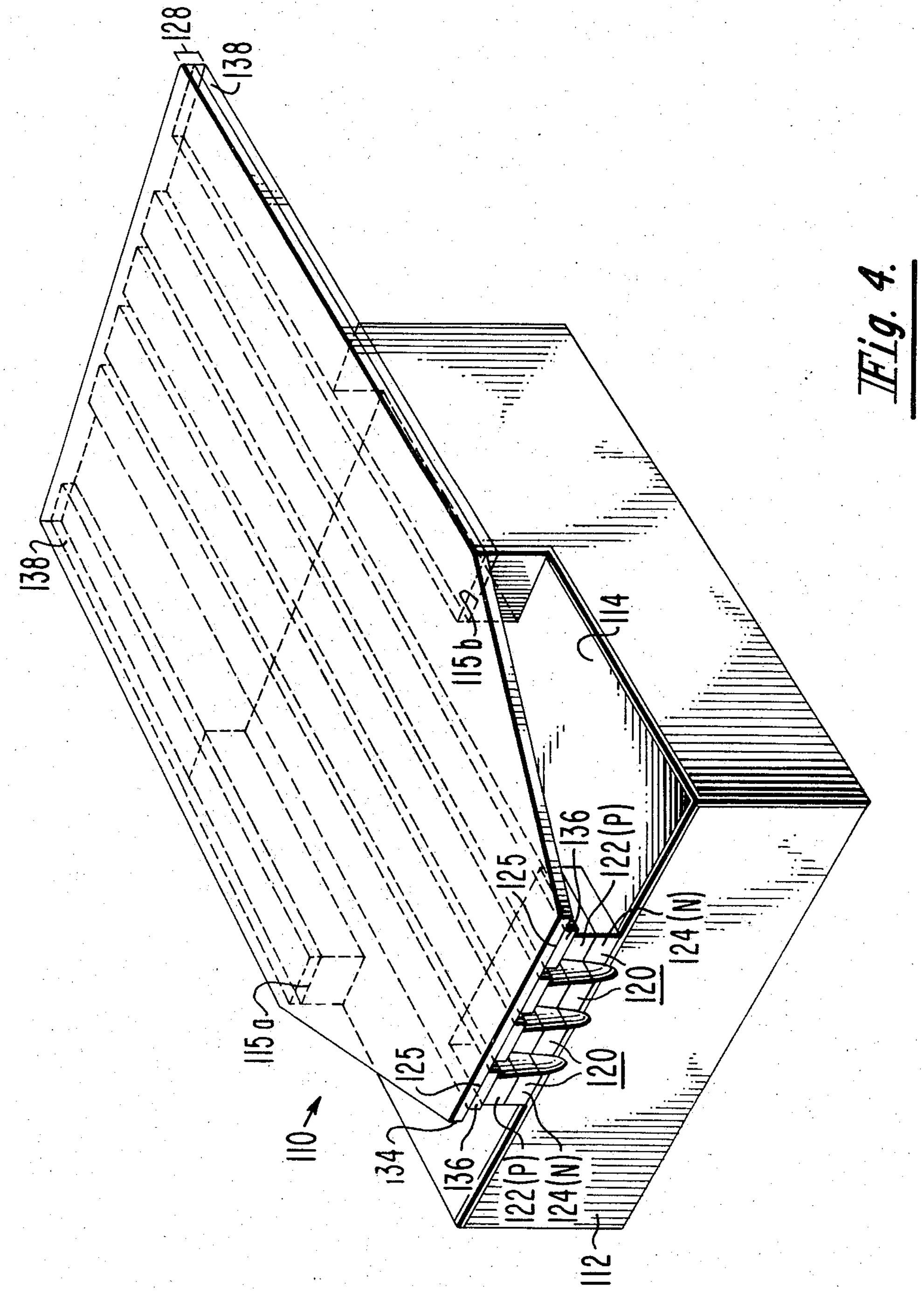
FIG. 4 is a perspective view of a second form of a high density light emitting diode array of the present invention.
Figure 5:
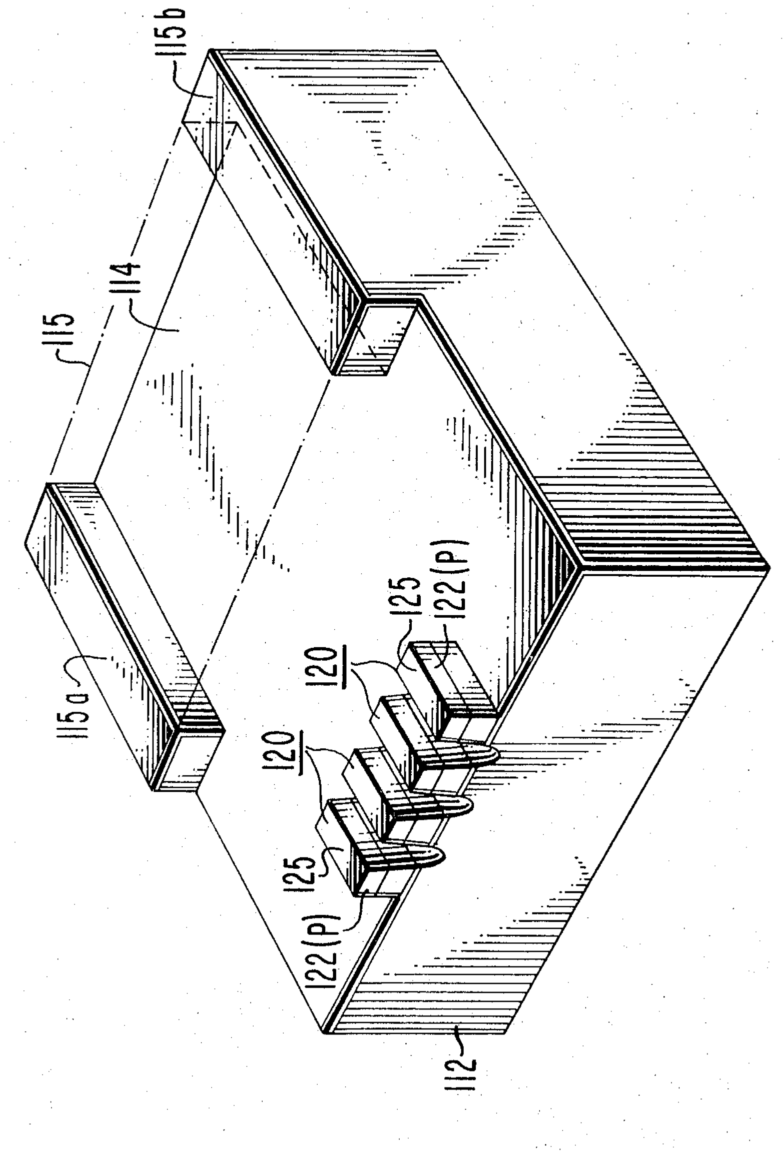
FIG. 5 is a perspective view of a subassembly for the second form of the high density light emitting diode of the present invention.

Another form of high density light emitting diode array 110 is shown in FIG. 4. The high density light emitting diode array 110 comprises a conductive substrate 112 having a recess 114 formed in a surface 115 thereof with a pair of substantially coplanar surfaces 115*a* and 115*b*, each transversely spaced from the recess 114 as shown in FIG. 5. A plurality of light emitting diodes 120 are mounted in spaced relation in the recess 114 of the conductive substrate 112 as shown in FIGS. 4 and 5. The conductive substrate 112 functions as a base as well as a common connection for the light emitting diodes 120. Each one of the light emitting diodes is mounted in the recess as previously mentioned, e.g., with regions of the same conductivity type in contacting relation with the conductive substrate. The surfaces 125 of the regions 122 of opposite conductivity of each one of the light emitting diodes are substantially coplanar with the surfaces 115*a* and 115*b* of the conductive substrate 112. The laminated member 128 can be employed for electrically connecting the light emitting diodes to a source of electrical energy capable of applying an electrical current across each light emitting diode 120 as shown in FIG. 4.

The high density light emitting diode array 110 of FIG. 4 can be constructed by following the methods previously mentioned to form the desired recess and then to form the diodes. The high density light emitting diode array 110 reduces the number of pieces in the total assembly to two major items, the base with the diodes and the laminated member, thereby leading to lower production costs and better performance due to the heat sink provided by the conductive substrate 112.

Although the high density light emitting diode array of the present invention has been illustrated with a single high density light emitting diode array, the high density light emitting diode array of the present invention may be used singly, or stacked on top of each other to provide a high density of precisely located diodes. Furthermore, although the high density light emitting diode array of the present invention has been described as including light emitting diodes having only two layers of opposite conductivity type, the arrays would be equally successful if multiple layers of diode material were utilized. Thus, there is provided by the present invention a high density light emitting diode array that substantially overcomes or minimizes the disadvantages of the prior art arrays. The arrays of the present invention are simply and inexpensively manufactured and are capable of providing an optically aligned pattern with ease of electrical connection.

I claim:

1. A high density light emitting diode array comprising:

a conductive substrate having a recess in a surface thereof, and a plurality of light emitting diodes, each of said light emitting diodes having regions of opposite conductivity type which form a PN junction, each of said regions having a surface and each light emitting diode having a light emitting end surface, said light emitting diodes being mounted in spaced relation in said recess of said substrate with the surfaces of one of the regions of the same conductivity being in electrical contact with said substrate, the surfaces of the regions of the opposite conductivity being substantially coplanar with at least a portion of said surface of said substrate, and said light emitting end surfaces facing in substantially the same direction.

2. A high density light emitting diode array in accordance with claim 1 including means for applying an electrical current across each one of said light emitting diodes.

3. A high density light emitting diode array in accordance with claim 2 in which a plurality of substantially coplanar contact terminals are each mounted on a separate one of said surfaces of said regions of opposite conductivity and on said portion of said surface of said substrate.

4. A high density light emitting diode array in accordance with claim 3 in which said contact terminals are conducting strips mounted on a surface of an insulating layer.

5. A high density light emitting diode array in accordance with claim 4 including a conducting layer on another surface of said insulating layer, and means electrically connecting said conducting layer to said substrate.

6. A high density light emitting diode array in accordance with claim 5 in which said conducting layer is electrically connected to a contact terminal mounted on said portion of said surface of said substrate by a conducting passageway through said insulating layer.

* * * * *